United States Patent [19]

Murakami

[11] Patent Number: 4,592,880

[45] Date of Patent: Jun. 3, 1986

[54] PROCESS FOR PRODUCING A PIEZO- AND PYRO-ELECTRIC FILM

[75] Inventor: Kunio Murakami, Uji, Japan

[73] Assignee: Unitika Ltd., Amagasaki, Japan

[21] Appl. No.: 627,552

[22] Filed: Jul. 3, 1984

[30] Foreign Application Priority Data

Jul. 7, 1983 [JP] Japan ................................ 58-124148

[51] Int. Cl.⁴ ...................... B29C 71/04; B29C 55/12; H04R 17/00
[52] U.S. Cl. .................................... 264/22; 29/25.35
[58] Field of Search .................... 264/22, 24; 29/25.35

[56] References Cited

U.S. PATENT DOCUMENTS

| | | | |
|---|---|---|---|
| 4,227,111 | 10/1980 | Cross et al. | 29/25.35 X |
| 4,265,841 | 5/1981 | Fujimori et al. | 264/22 |
| 4,268,653 | 5/1981 | Uchidol et al. | 264/22 X |
| 4,308,370 | 12/1981 | Fukada et al. | 264/22 X |
| 4,407,054 | 10/1983 | Zipfel, Jr. | 29/25.35 |

FOREIGN PATENT DOCUMENTS

| | | | |
|---|---|---|---|
| 51-47298 | 4/1976 | Japan | 29/25.35 |
| 57-23286 | 2/1982 | Japan | 264/22 |

OTHER PUBLICATIONS

D. P. Skinner et al., "Flexible Composite Transducers", Mat. Res. Bull., vol. 13, No. 6, pp. 599–607, Jun. 1978.

Primary Examiner—Jan Silbaugh
Attorney, Agent, or Firm—Oblon, Fisher, Spivak, McClelland & Maier

[57] ABSTRACT

A process for producing a piezo- and pyro-electric film, which comprises biaxially stretching a single- or multi-layered thermoplastic film containing from 3 to 80% by volume, as an average based on the entire film, of a ferroelectric substance, then subjecting the stretched film to polarization treatment by applying a high voltage at a temperature within a range of from 10° C. to a temperature lower than the melting point of said thermoplastic resin, and cooling the film while continuously applying the high voltage.

11 Claims, No Drawings

PROCESS FOR PRODUCING A PIEZO- AND PYRO-ELECTRIC FILM

The present invention relates to a process for producing a very thin thermoplastic film having piezo- and pyro-electric characteristics and high strength.

Piezo- and pyro-electric characteristics are usually observed in ferroelectric substances. In the case of inorganic substances, barium titanate, titanic acid and a lead zirconate solid solution (i.e. so-called PZT), are well known. In the case of organic substances, fluorine compounds such as polyvinylidene fluoride, are well known. For instance, Japanese Examined Patent Publication No. 22271/1973, or Japanese Unexamined Patent Publication No. 80202/1980 discloses a process for producing a ferroelectric porcelain. Further, Japanese Examined Patent Publication No. 13830/1975, or Japanese Unexamined Patent Publication No. 22974/1972, No. 20870/1973 or No. 39580/1977, discloses an instance wherein polyvinylidene fluoride is used. Furthermore, with respect to a piezo-electric element prepared by a combination of these inorganic and organic substances, Japanese Unexamined Patent Publication Nos. 139398/1975, 139399/1975, 23698/1976, 29998/1977, 97199/1977, 157297/1979, 96689/1980 or 155496/1979, or Japanese Examined Patent Publication No. 47159/1977, discloses a process wherein a ferroelectric porcelain powder is added to a high molecular compound, particularly rubber or polyvinylidene fluoride, and the mixture is formed into a sheet by means of a pair of rolls.

These conventional materials have fairly good piezo-electric characteristics. However, in the case of a material composed solely of ceramics, there has been a serious drawback that it is brittle and likely to be broken. Further, even when combined with a high polymer compound, no adequate strength can be obtained since the composite material is used in a non-stretched state, and the durability or vibration characteristics are inferior, since the Young's modulus is low. Further, these materials can only be formed into a thick plate or sheet, and thus have poor applicability.

Under the circumstances, an extensive research has been conducted with an aim to overcome the above-mentioned drawbacks. As a result, it has now been found that a thermoplastic film having excellent piezo- and pyro-electric characteristics and high strength can readily be obtained in a thin film form by a specific combination of biaxial stretching treatment and subsequent polarization treatment.

Namely, the present invention provides a process for producing a piezo- and pyro-electric film, which comprises biaxially stretching a single- or multi-layered thermoplastic film containing from 3 to 80% by volume, as an average based on the entire film, of a ferroelectric substance, then subjecting the stretched film to polarization treatment by applying a high voltage at a temperature within a range of from 10° C. to a temperature lower than the melting point of said thermoplastic resin, and cooling the film while continuously applying the high voltage.

Now, the present invention will be described in detail with reference to the preferred embodiments.

The piezo- and pyro-electric film of the present invention is extremely strong as compared with the conventional products, since the strength is maintained by the biaxially stretched thermoplastic resin, and yet flexible. Thus, it has excellent durability and response characteristics. Further, it can be fabricated into a very thin film, which can readily be deformed by a very small stress, and which is thus capable of providing a quick response. During the biaxial stretching for the preparation of the piezo- and pyro-electric film of the present invention, particles of the ferroelectric substance are subjected to the shearing stress resulting from the molecular chain orientation of the thermoplastic resin, and undergo a change in their state from a randomly dispersed state in the non-stretched film to an oriented state as stretched in an axial direction or in an in-plane direction. This change in the state serves advantageously for a piezo-electric film. Namely, the piezo-electric film is frequently used for the conversion of a stress exerted in the in-plane or axial direction to an electric energy and vice versa, and such a conversion can be efficiently conducted by the film of the present invention. Whereas, in a case where particles of a ferroelectric substance are merely incorporated into a non-stretched film, the particles are dispersed randomly and thus serve to one another to cancel out the electric energy, whereby the electro-mechanical conversion efficiency is poor.

As the thermoplastic resin to be used in the present invention, there may be mentioned polyethylene, polypropylene, poly-4-methylpentene-1, polyvinyl chloride, polyethylene terephthalate, polybutylene terephthalate, polyvinyl alcohol, polyvinylidene fluoride, a polyvinylidene-ethylene trifluoride copolymer, a polyethylene-tetrafluoroethylene copolymer and poly-$\epsilon$-capramide, or a mixture or a copolymer thereof. However, the thermoplastic resin is not restricted to these specific examples, and various other types of thermoplastic resins may also be employed. Among them, polypropylene, polyethylene terephthalate, polyvinylidene fluoride, a polyvinylidene fluoride-ethylene trifluoride copolymer and poly-$\epsilon$-capramide are particularly preferred in view of the properties and workability.

As the ferroelectric substance for the present invention, a single substance such as a metal titanate, a metal stannate or a metal zirconate, or a mixture or solid solution thereof, is particularly suitable. However, the ferroelectric substance is not restricted to these specific examples, and any ferroelectric substance may be employed so long as it has a dieletric constant of at least about 5 and piezo- and pyro-electric characteristics. The effect of the addition is obtainable when it is added in an amount of at least 3% by volume. However, in order to obtain a remarkable effectiveness, the ferroelectric substance is used preferably in an amount of at least 7% by volume. On the other hand, if it is added in an excess amount, the dispersibility into the thermoplastic resin tends to be poor, and the stretchability tends to be impaired. Accordingly, it is preferred to incorporate it in an amount of not higher than 80% by volume. As specific examples of the matal titanate, the metal stannate, and the metal zirconate, there may be mentioned $BaTiO_3$, $SrTiO_3$, $CaTiO_3$, $Mg_2O_4$, $MgTiO_3$, $Bi_2(TiO_3)_3$, $PbTiO_3$, $NiTiO_3$, $CaTiO_3$, $ZnTiO_3$, $Zn_2TiO_4$, $BaSnO_3$, $Bi_2(SnO_3)_3$, $CaSnO_3$, $PbSnO_3$, $MgSnO_3$, $SrSnO_3$, $ZnSnO_3$, $BaZrO_3$, $CaZrO_3$, $PbZrO_3$, $MgZrO_3$, $SrZrO_3$ and $ZnZrO_3$. However, they are not restricted to these specific examples. These materials may be used alone. However, it is possible to improve the effectiveness by a combination thereof. No substantial improvement will be obtained by a mere mixture thereof. In order to obtain an improvement, it is usually necessary to heat and sinter the mixture to change the crystal structure. In such a case, the mixing ratio and the sintering temperature may be varied depending upon the particular purpose. For instance, when CaTiO₃ is added to BaTiO₃, the transformation temperature of the crystal moves to the low temperature side and becomes advantageous for use at a normal temperature. Further, when PbTiO₃ is added to BaTiO₃, the Curie point rises, whereby the useful temperature range can be widened as in the case of the addition of CaTiO₃. However, if the amount of the addition is excessive, the electro-mechanical coupling coefficient tends to be small, whereby the piezoelectric characteristics will be impaired. Accordingly, it is preferred that the amount of addition is not greater than 10 mol %. Among various combinations, a combination of PbZrO₃ and PbTiO₃ is most effective to obtain excellent piezo-electric characteristics. At a ratio of PbZrO₃ to PbTiO₃ being Zr/Ti=55/45, there is a border line of the crystal system between the tetragonal system phase and the trigonal system phase. With the composition in the vicinity of this border line, the electro-mechanical coupling coefficient becomes to be the greatest, and a great piezo-electric effect is obtainable.

The best result may be obtained with a composition comprising from 35 to 65 mol % of PbTiO₃ and from 65 to 35 mol % of PbZrO₃.

Further, a solid solution of Pb, La, Zr and Ti makes an effective piezo-electric element. This is so-called PLZT. The solid solution preferably has a composition represented by the formula:

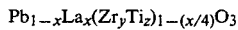

$$Pb_{1-x}La_x(Zr_yTi_z)_{1-(x/4)}O_3$$

where x is from 1 to 0.05 and y/z is from 50/50 to 80/20. In this case, a transparent solid solution is obtainable. Accordingly, the composite film thereby obtained will have excellent transparency. To maximize the transparency, it is preferred to employ a composition satisfying y/z=65/35 and x=0.8-0.1.

As a method for dispersing the ferroelectric substance in the thermoplastic resin, followed by film-forming, it is common to employ a method wherein a ferroelectric substance presintered at a temperature of from 1000° to 1300° C., is pulverized into powder, and then mixed with a thermoplastic resin, and the mixture is molded into a film by melt-extrusion molding. The mixing method includes a method wherein the ferroelectric substance is added during the polymerization of the thermoplastic resin, or a method wherein the ferroelectric substance and the thermoplastic resin are directly blended by means of a single-screw or double-screw extruder. However, the mixing method is not restricted to these specific methods. For the film-forming operation, it is common to empoly a method wherein the thermoplastic resin containing the ferroelectric substance, is heated and melted by an extruder, extruded from a T-die or a ring die, and then cooled for solidification. As an alternative method, it is possible to employ a method wherein the ferroelectric substance is added to a solution in which the thermoplastic resin is dissolved or dispersed, and then the solution is spread on a substrate and the solvent is evaporated. Furthermore, it is possible to employ a method wherein at the time of the addition of the ferroelectric substance, a silane-type, a titanate-type or an aluminum-type coupling agent is coated on the surface of the ferroelectric substance to improve the adhesion of the interface. As specific examples of such a coupling agent, there may be mentioned, for example, γ-aminopropyltriethoxysilane, γ-glycidoxypropyltrimethoxysilane, γ-mercaptopropyltrimethoxysilane, γ-chloropropyltrimethoxysilane, γ-methacryloxypropyltrimethoxysilane, vinyltriethoxysilane, isopropyltriisostearoyl titanate, isopropyldodecyl benzenesulfanyl titanate, isopropyltris(dioctylbiphosphate) titanate. However, the coupling agent is not restricted to these specific examples.

The film to be formed may be a single layered or multi-layered. The film is required to contain at least 3% by volume, preferably at least 7% by volume, as an average of the entire film, of the ferroelectric substance to obtain distinct piezo-electric effectiveness. There is no particular restriction to the method for forming a multi-layered film. It is possible to employ an extrusion lamination method, a dry lamination method, a solution-coating method, a hot melt coating method or a co-extrusion method. Further, the types of the resins for the respective layers may be varied taking the stretchability into consideration. In a case where the content of the ferroelectric substance is great, particularly more than 15% by volume, or in a case where the stretchability of the thermoplastic resin is poor, good results may be obtained by laminating a thermoplastic resin containing no substantial amount of the ferroelectric substance or other thermoplastic resin having good stretchability, followed by stretching. For instance, in the case of polyvinylidene fluoride containing at least 8% by volume of the ferroelectric substance, the biaxial stretching is difficult, but the stretching becomes possible by employing a method wherein it is laminated with poly-ε-capramide and then stretched.

For the biaxial stretching, there may be employed either a so-called successive biaxial stretching wherein the film is first longitudinally stretched and then transversely stretched, or a simultaneous biaxial stretching in which the stretching in the longitudinal and transverse directions is conducted simultaneously. However, the simultaneous biaxial stretching is preferred, since the stretching can smoothly be operated and good results are obtainable even when the amount of the ferroelectric substance is great.

In the case of the successive biaxial stretching, the film is first oriented in the longitudinal direction and then oriented in the transverse direction, whereby anisotropy of orientation is likely to form in the in-plane of the film, and the piezo-electric constant tends to be irregular. Whereas, in the case of the simultaneous biaxial stretching, uniform orientation can be maintained, whereby the piezo-electric constant will not be irregular. The stretching rate is at least 1.1 times in both longitudinal and transverse directions to obtain the effectiveness. In order to obtain a remarkable effect, the stretching rate is preferably at least 1.5 or 2 times in both longitudinal and transverse directions.

The stretching temperature may vary depending upon the amount of the ferroelectric substance and the glass transition temperature and the melting point of the thermoplastic resin. In the case of the simultaneous biaxial stretching, the stretching temperature is preferably within a range of from (Tg−10) to (Tm−20+V)° C., and in the case of the successive biaxial stretching, it is preferred to conduct the longitudinal stretching at a temperature of from (Tg−10) to (Tm−30+V)° C. and then transversely stretching at a temperature of from Tg to (Tm−20+V)° C., to obtain good results, where Tg is the glass transition temperature (°C.) of the thermoplastic resin, Tm is the melting point (°C.) of the thermoplastic resin and V is the content (% by volume) of the ferroelectric substance as an average value of the entire film. As a method for improving the strength of the film or for the formation of a thin film, it is possible to employ mono-axial stretching instead of the biaxial stretching as in the present invention. In such a case, however, the differences in the elasticity and the strength between the stretching direction and the direction perpendicular thereto, are substantial and great anisotropy in the piezo-electric characteristics will be formed, although the strength in the stretching direction can be improved and a thin film may be obtained.

The polarization treatment after the stretching is conducted at a temperature of at least 20° C., preferably at least 40° C. while applying a direct current voltage. If the temperature is too high, the fluidity or melting of the thermoplastic resin becomes excessive. Accordingly, the treatment has to be conducted at a temperature lower than the melting point or the pour point of the thermoplastic resin, preferably at a temperature lower by 10° C. than the melting point or pour point. The voltage to be applied is usually within a range of from 2 V/$\mu$ to 300 v/$\mu$, preferably 10 V/$\mu$ to 200 v/$\mu$, whereby good results are obtainable. The time for the polarization treatment is selected within a range of from 10 minutes to 4 hours depending upon the types of the ferroelectric substance and the thermoplastic resin used.

If the applied voltage is removed at a temperature higher than the temperature for the polarization treatment, the piezo- and pyro-electric characteristics will diminish. Therefore, after the completion of the polarization treatment, it is necessary to cool the film to a temperature lower than the temperature for the polarization treatment while continuously applying the voltage.

The piezo- and pyro-electric film of the present invention may be used for a headphone, a speaker, a microphone, a phonocartridge or a telephone apparatus in the audio field, by utilizing its piezo-electric characteristics. Further, as a supersonic transducer, it is applicable to a hydrophone, a supersonic microscope, a fish finder or a submarine sonar. As other applications, it may be used for a supersonic diagnostic appatatus, a sphygmomanometer, a phonocardiographic microphone, a pressure meter, an impact meter, a vibrator, a keyboard, etc. As an application of its pyro-electric characteristics, it may be employed for an infrared sensor, a laser power meter, an infrared vidicon, a radiation thermometer, a millimeter wave detector, a fire alarm, an invader detector, a copy machine, etc.

Now, the present invention will be described in further detail with reference to Examples. However, it should be understood that the present invention is by no means restricted by these specific Examples.

EXAMPLE 1

Powders of $PbTiO_3$ and $PbZrO_3$ were mixed to obtain a composition comprising 47 mol % of $PbTiO_3$ and 53 mol % of $PbZrO_3$. The mixture was sintered at a temperature of 1250° C. for about 1 hour, and then pulverized to obtain a powder. This powder was added to polyethylene terephthalate chips in an amount of 20% by volume, and the mixture was heated and melted by an extruder to obtain blend chips. This blend chips were further heated and melted at 280° C. by an extruder, and extruded from a T-die to obtain a film having a thickness of 70 $\mu$m. This non-stretched film was simultaneously biaxially stretched at 100° C. at a stretching rate of 2.8×2.8 times (i.e. 2.8 times in each of the longitudinal and transverse directions). Then, aluminum was vapor-deposited on both sides, and then a direct current voltage of 50 V/$\mu$ was applied at 120° C. for 30 minutes. Then, the film was oC for 30 minutes. Then, the film was cooled to room temperature while continuously applying the voltage. The piezo-electric characteristic of the film thereby obtained was $18 \times 10^{-12}$ C/N at $d_{31}$. Further, the pyroelectricity at 50° C. was as strong as $1.2 \times 10^{-8}$ C/cm²·deg. Thus, the film had excellent piezo- and pyro-electric characteristics.

EXAMPLE 2

The same blend chips as used in Example 1 and non-blended polyethylene terephthalate chips were subjected to co-extrusion so that the blend layer constituted the center layer, whereby a three layered non-stretched film having a thickness of 10/40/10 m was prepared. This non-stretched film was simultaneously biaxially stretched at a stretching rate of 3×3 times at 100° C. Then, aluminum was vapor-deposited on both sides, and then a direct current voltage of 100 V/$\mu$ was applied at 110° C. for 50 minutes. The film was cooled to room temperature while continuously applying the voltage. The piezo-electric characteristic of the film thus obtained, was $14 \times 10^{-12}$ C/N at $d_{31}$. Further, the pyroelectricity at 50° C. was $0.9 \times 10^{-8}$ C/cm²·deg. Thus, the film had excellent piezo- and pyro-electric characteristics.

EXAMPLE 3

The sintered powder as used in Example 1 was added to polyvinylidene fluoride in an amount of 30% by volume, and the mixture was heated and melted in an extruder to obtain blend chips. The blend chips and poly-$\epsilon$-capramide were subjected to co-extrusion to obtain a non-stretched double-layered film having a thickness of 70/30 $\mu$m. This non-stretched film was simultaneously biaxially stretched at 130° C. at a stretching rate of 3×3 times. The polyvinylidene fluoride layer was peeled off and aluminum was vapor-deposited on both sides, and then a direct current voltage of 120 V/$\mu$ was applied at 110° C. for 2 hours. The film was cooled to room temperature while continuously applying the voltage. The piezo-electric characteristic of the film thus obtained, was $28 \times 10^{-12}$ C/N at $d_{31}$. Further, the pyroelectricity at 50° C. was $2.3 \times 10^{-8}$ C/cm²·deg. Thus, the film had excellent piezo- and pyro-electric characteristics.

EXAMPLE 4

$PbTiO_3$ powder was added to polypropylene chips in an amount of 30% by volume. The mixture was heated and melted in an extruder to obtain blend chips. The blend chips were heated and melted in an extruder at 240° C., and extruded from T-die to obtain a non-stretched film having a thickness of 100 $\mu$m. This non-stretched film was longitudinally stretched at 130° C. at a stretching rate of 4 times, and then transversely stretched at 150° C. at a stretching rate of 4 times. To both sides of the biaxially stretched film, aluminum was vapor-deposited in a thickness of 500Å, and then a direct current voltage of 150 V/$\mu$ was applied at 100° C. for 1 hour. The film was cooled to room temperature while continuously applying the voltage. The pyroelectricity of the film thus obtained, was as good as $1.8 \times 10^{-8}$ C/cm²·deg.

EXAMPLE 5

To PbTiO$_3$ powder, 0.3% by weight of γ-aminopropyltriethoxysilane was added, and mixed by a Henschel mixer. The mixture was added to polypropylene chips in an amount of 30% by volume. Then, in the same manner as in Example 4, a non-stretched film having a thickness of 100 μm was prepared. This non-stretched film was longitudinally stretched at 130° C. at a stretching rate of 4 times, and then transversely stretched at 150° C. at a stretching rate of 4 times. The breakage at the time of the stretching was very little as compared with the case where no silane treatment was applied. The polarization treatment was conducted in the same manner as in Example 4. The pyroelectricity of the film thus obtained was as good as $1.9 \times 10^{-8}$ C/cm$^2$·deg.

EXAMPLE 6

PbO, La$_2$O$_3$, ZrO$_2$ and TiO$_2$ were mixed for about 3 hours while adding acetone, to obtain a composition represented by Pb$_{0.8}$La$_{0.2}$(Zr$_{0.65}$Ti$_{0.35}$)$_{0.95}$O$_3$. The mixture was dried at 100° C. for 24 hours. Then, the mixture was presintered at 900° C. for 2 hours, then pulverized, again presintered at 700° C. for 2 hours, and again pulverized. The powder thus obtained was added to polyethylene terephthalate in an amount of 20% by volume. The mixture was melted in an extruder to obtain blend chips. The blend chips were further heated and melted at 280° C. in an extruder, and extruded from a T-die to obtain a film having a thickness of 100 μm. The non-stretched film thus obtained was simultaneously biaxially stretched at 120° C. at a stretching rate of 3×3 times. Then, aluminum was vapor-deposited on both sides, and then a direct current voltage of 80 V/μ was applied at 110° C. for 40 minutes. The film was cooled to room temperature while continuously applying the voltage. The piezo-electricity of the film thus obtained was $12 \times 10^{-12}$ C/N at d$_{31}$.

COMPARATIVE EXAMPLE 1 and EXAMPLES 7 to 18

Non-stretched films were prepared in the same manner as in Example 1 except that the concentration of the ferroelectric substance was varied. The non-stretched films were simultaneously biaxially stretched at a stretching rate of 3×3 times at various stretching temperatures, and then subjected to the polarization treatment in the same manner as in Example 1. The stretchability and the piezo-electric characteristics were evaluated. The results are shown in Table 1. The polyethylene terephthalate had a glass transition temperature of 80° C. and a melting point of 260° C. as determined by DSC measurement.

TABLE 1

| | Ferroelectric substance (% by volume) | Stretching temperature (°C.) | Stretchability | Piezoelectric coefficient d$_{31}$ ($10^{-12}$ C/N) |
|---|---|---|---|---|
| Comparative Example 1 | 10 | 60 | Broken | — |
| Example 7 | 10 | 80 | Good | 9 |
| Example 8 | 10 | 100 | Good | 9 |
| Example 9 | 10 | 120 | Good | 11 |
| Example 10 | 20 | 85 | Good | 16 |
| Example 11 | 20 | 110 | Good | 18 |
| Example 12 | 20 | 130 | Good | 19 |
| Example 13 | 30 | 90 | Good | 25 |
| Example 14 | 30 | 120 | Good | 27 |
| Example 15 | 30 | 140 | Good | 27 |
| Example 16 | 50 | 100 | Good | 37 |
| Example 17 | 50 | 130 | Good | 39 |
| Example 18 | 50 | 150 | Good | 37 |

COMPARATIVE EXAMPLES 2 and 3, and EXAMPLES 19 to 25

Non-stretched films were prepared in the same manner as in Example 4 except that the PbTiO$_3$ powder was added to polypropylene chips in various concentrations. The non-stretched films were successively biaxially stretched at a stretching rate of 4 times in each of the longitudinal and transverse directions at various stretching temperatures, and then subjected to the polarization treatment in the same manner as in Example 4. The stretchability and the piezo-electric characteristics were evaluated. The results are shown in Table 2. The polypropylene had a glass transition temperature of −18° C. and a melting point of 167° C. as determined by DSC measurement.

TABLE 2

| | PbTiO$_3$ (% by volume) | Longitudinal stretching | | Transverse stretching | | Piezoelectric coefficient d$_{31}$ ($10^{-12}$ C/N) |
| | | Stretching temperature (°C.) | Stretchability | Stretching temperature (°C.) | Stretchability | |
|---|---|---|---|---|---|---|
| Example 19 | 10 | 120 | Good | 130 | Good | 6 |
| Example 20 | 10 | 130 | Good | 150 | Good | 8 |
| Comparative Example 2 | 10 | 140 | Good | 160 | Broken | — |
| Example 21 | 20 | 130 | Good | 140 | Good | 13 |
| Example 22 | 20 | 140 | Good | 150 | Good | 13 |
| Comparative Example 3 | 20 | 150 | Good | 160 | Slightly necked by stretching | 4 |
| Example 23 | 30 | 140 | Good | 150 | Good | 15 |
| Example 24 | 30 | 150 | Good | 160 | Good | 19 |
| Example 25 | 30 | 150 | Good | 165 | Good | 17 |

I claim:

1. A process for producing a piezo- and pyro-electric film having high strength and without great anisotrophy in the Piezo-electric characteristics, which comprises biaxially stretching a single- or multi-layered thermoplastic film containing from 3 to 80% by volume, as an average based on the entire film, of a ferroelectric substance such that during the biaxial stretching, particles of the ferroelectric substance are subjected to the shearing stress resulting from molecular chain orientation of the thermoplastic resin of the film and undergo a change in their state from a randomly dispersed state in the non-stretched film to an oriented state as stretched, then subjecting the stretched film to polarization by applying a high voltage at a temperature within a range of from 10° C. to a temperature lower than the melting point of said thermoplastic resin, and cooling the film while continuously applying the high voltage.

2. The process according to claim 1, wherein the ferroelectric substance is at least one of a metal titanate, a metal stannate and a metal zirconate, or a solid solution thereof.

3. The process according to claim 1, wherein the ferroelectric substance is a solid solution comprising from 35 to 65 mol % of $PbTiO_3$ and from 65 to 35 mol % of $PbZrO_3$.

4. The process according to claim 1, wherein the ferroelectric substance is a solid solution represented by the following formula:

$$Pb_{1-x}La_x(Zr_yTi_z)_{1-x/4}O_3$$

where x is from 1 to 0.05, and y/z is from 50/50 to 80/20.

5. The process according to claim 1, wherein the film contains from 0.01 to 10% by weight, relative to the ferroelectric substance, of a coupling agent.

6. The process according to claim 1, wherein the thermoplastic resin is a homopolymer of polyethylene terephthalate, poly-ε-capramide, polyvinylidene fluoride or polypropylene, or a copolymer composed mainly thereof.

7. The process according to claim 1, wherein the biaxial stretching is conducted by a simultaneous biaxial stretching method.

8. The process according to claim 1, wherein the thermoplastic film is simultaneously biaxially stretched at a temperature from $(Tg-10)°$ to $(Tm-20+V)°$ C., where Tg is the glass transition temperarure (°C.) of the thermoplastic resin, Tm is the melting point (°C.) of the thermoplastic resin, and V is the content (% by volume), as an average of the entire film, of the ferroelectric substance.

9. The process according to claim 1, wherein the biaxial stretching is conducted by a two-way successive biaxial stretching method.

10. The process according to claim 1, wherein the thermoplastic film is longitudinally stretched at a temperature of from $(Tg-10)°$ to $(Tm-30+V)°$ C., and then transversely stretched at a temperature of from $Tg°$ to $(Tm-20+V)°$ C., where Tg is the glass transition temperature (°C.) of the thermoplastic resin, Tm is the melting point (°C.) of the thermoplastic resin, and V is the content (% by volume), as an average of the entire film, of the ferroelectric substance.

11. The process according to claim 1, wherein a voltage of from 2 V/μ to 300 V/μ is applied over a period of from 10 minutes to 4 hours at a temperature within a range of from 20° C. to a temperature lower by 10° C. than the melting point or pour point of the thermoplastic resin.

* * * * *